(12) United States Patent
Vellianitis et al.

(10) Patent No.: US 12,453,295 B2
(45) Date of Patent: Oct. 21, 2025

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Georgios Vellianitis, Heverlee (BE); Marcus Johannes Henricus Van Dal, Linden (BE); Gerben Doornbos, Kessel-Lo (BE)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/518,643

(22) Filed: Nov. 24, 2023

(65) Prior Publication Data

US 2024/0090351 A1 Mar. 14, 2024

Related U.S. Application Data

(63) Continuation of application No. 16/925,272, filed on Jul. 9, 2020, now Pat. No. 11,856,874.

(51) Int. Cl.
*H10N 70/20* (2023.01)
*H10N 70/00* (2023.01)

(52) U.S. Cl.
CPC .......... *H10N 70/25* (2023.02); *H10N 70/021* (2023.02); *H10N 70/253* (2023.02); *H10N 70/823* (2023.02); *H10N 70/884* (2023.02)

(58) Field of Classification Search
CPC ...................................................... H10N 70/25
See application file for complete search history.

(56) References Cited

U.S. PATENT DOCUMENTS

| | | | | |
|---|---|---|---|---|
| 2006/0239060 | A1* | 10/2006 | Shimada | H01L 29/6684 365/145 |
| 2013/0270508 | A1* | 10/2013 | Li | H10B 63/80 977/762 |
| 2021/0083122 | A1* | 3/2021 | Naylor | H01L 29/78696 |
| 2021/0399138 | A1* | 12/2021 | Jariwala | H10D 64/033 |

OTHER PUBLICATIONS

"Tunable optoelectronic and ferroelectric properties in Sc-based III-nitrides", S. Zhang et al., J. Appl. Phys. 114, 133510 (2013); (Year: 2013).*

* cited by examiner

*Primary Examiner* — Ajay Ojha
*Assistant Examiner* — Hajar Kolahdouzan
(74) *Attorney, Agent, or Firm* — WPAT LAW; Anthony King (57) ABSTRACT

A semiconductor structure includes a substrate; a resistance variable layer disposed over the substrate; a gate structure disposed over the resistance variable layer; a dielectric layer disposed over the resistance variable layer and surrounding the gate structure; a first contact plug disposed over the resistance variable layer and extending through the dielectric layer; and a second contact plug disposed over the resistance variable layer and opposite to the first contact plug and extending through the dielectric layer, wherein the resistance variable layer is semiconductive and ferroelectric. A method of manufacturing a semiconductor structure is also disclosed.

20 Claims, 9 Drawing Sheets

SEMICONDUCTOR STRUCTURE AND MANUFACTURING METHOD THEREOF

PRIORITY CLAIM AND CROSS-REFERENCE

This application is a continuation application of U.S. Non-Provisional application Ser. No. 16/925,272 filed on Jul. 9, 2020 entitled "SEMICONDUCTOR STRUCTURE AND MANUFACTURING METHOD THEREOF," which is hereby incorporated herein by reference.

BACKGROUND

Electronic equipment using semiconductor devices is essential for many modern applications. With the advancement of electronic technology, the semiconductor devices are becoming increasingly smaller in size while having greater functionality and greater amounts of integrated circuitry. Many modern electronic devices contain electronic memory configured to store data. As the semiconductor industry has progressed into nanometer technology process nodes in pursuit of higher device density, higher performance, and lower costs, it is desirable to incorporate and merge logic circuits having various functions with non-volatile memory circuits within one chip.

Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, low susceptibility to damage from radiation, and significantly smaller size compared to other kinds of memory cell.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art.

Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the present disclosure, a semiconductor structure is disclosed. The semiconductor structure includes a substrate, a resistance variable layer over the substrate, at least two contact plugs disposed over and extending from the resistance variable layer, and a gate structure disposed over the resistance variable layer and between the contact plugs. The resistance variable layer is semiconductive and ferroelectric. Since the resistance variable layer is ferroelectric, polarization states of the resistance variable layer is switchable. Further, since the resistance variable layer is semiconductive, a current flowing through the resistance variable layer is varied depending on the polarization states. The switching of the polarization states results in a range of a current flowable through the resistance variable layer. In other words, a wide memory window of the semiconductor structure is obtained.

Figure 1:
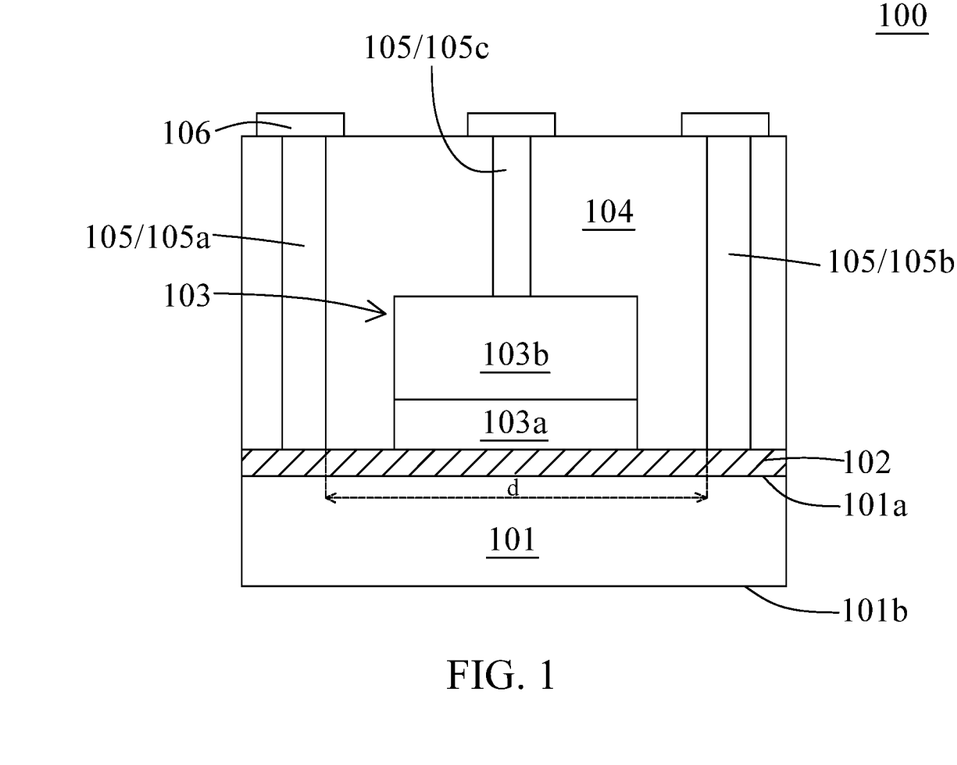
FIG. 1 is a schematic cross-sectional view of a first semiconductor structure in accordance with some embodiments of the present disclosure.

FIG. 1 is a schematic cross sectional view of a first semiconductor structure 100 in accordance with some embodiments of the present disclosure. In some embodiments, the first semiconductor structure 100 is a memory device or a part of a memory device. In some embodiments, the first semiconductor structure 100 includes a non-volatile memory cell. In some embodiments, the first semiconductor structure 100 is a ferroelectric field effect transistor (FeFET). In some embodiments, the first semiconductor structure 100 includes a substrate 101, a resistance variable layer 102 and a gate structure 103.

In some embodiments, the substrate 101 is a semiconductive substrate. In some embodiments, the substrate 101 includes a silicon substrate, a silicon germanium substrate, or a substrate formed of other semiconductor materials. In some embodiments, the substrate 101 includes silicon, silicon germanium, silicon carbide, or a group III-V semiconductor. In some embodiments, the substrate 101 includes silicon oxide, gallium nitride, gallium nitride, aluminum gallium nitride or the like.

In some embodiments, the substrate 101 is a silicon wafer including a shallow trench isolation (STI) disposed over the substrate. In some embodiments, a transistor in a metal oxide semiconductor (MOS) structure or complementary MOS structure is subsequently formed over the substrate 101, and the transistor is isolated from other components by the STI. In some embodiments, the substrate 101 may be doped with a p-type (e.g. boron or the like) or an n-type (e.g. phosphorus, arsenic or the like) impurity. In some embodiments, the substrate 101 is p-type substrate or n-type substrate.

In some embodiments, the substrate 101 includes a first surface 101a and a second surface 101b opposite to the first surface 101a. In some embodiments, the first surface 101a is a front side of the substrate 101, that electrical devices or components are subsequently formed over the first surface 101a. In some embodiments, the second surface 101b is a back side of the substrate 101, that electrical device or component is absent.

In some embodiments, the resistance variable layer 102 is disposed over the substrate 101. In some embodiments, the resistance variable layer 102 is disposed over the first surface 101a of the substrate 101. In some embodiments, the resistance variable layer 102 at least covers a portion of the substrate 101. In some embodiments, the resistance variable layer 102 covers an entire first surface 101a of the substrate 101. In some embodiments, the resistance variable layer 102 is conductive or semiconductive. In some embodiments, the resistance variable layer 102 allows a current ($I_D$) flowing through the resistance variable layer 102 under some specific conditions. In some embodiments, the current ($I_D$) can flow through the resistance variable layer 102 when a voltage substantially greater than a threshold voltage is applied to the gate structure 103.

In some embodiments, the resistance variable layer 102 is ferroelectric. In some embodiments, the resistance variable layer 102 is a ferroelectric channel. In some embodiments, the resistance variable layer 102 includes III-V semiconductor based ferroelectric material. In some embodiments, the resistance variable layer 102 is formed with ferroelectric crystalline. Several electric dipoles are formed in the ferroelectric crystalline. A position of the electric dipole is changeable within the ferroelectric crystalline by an application of an electric field. The resulted position of the electric dipole is dependent on a voltage applied to the first semiconductor structure 100. In some embodiments, the ferroelectric crystalline in the resistance variable layer 102 can be oriented in parallel to a direction of the current flowing through the resistance variable layer 102.

In some embodiments, the resistance variable layer 102 includes piezoelectric material. In some embodiments, the resistance variable layer 102 includes III-nitride. In some embodiments, the resistance variable layer 102 includes wurtzite nitride. In some embodiments, the resistance variable layer 102 includes scandium (Sc) and nitride (N). In some embodiments, the resistance variable layer 102 includes scandium doped nitride, yttrium doped nitride or the like. In some embodiments, the resistance variable layer 102 includes scandium doped aluminum nitride (AlScN), scandium doped indium nitride (InScN) or scandium doped gallium nitride (GaScN). In some embodiments, the resistance variable layer 102 includes a material with ferroelectric response.

In some embodiments, a first doped region and a second doped region (not shown) are formed over or in the resistance variable layer 102. In some embodiments, the first and second doped regions have a conductivity type different from a conductivity type of the resistance variable layer 102. In some embodiments, the first and second doped regions are in p-type or n-type. In some embodiments, the first doped region is a source region, and the second doped region is a drain region. In some embodiments, the source region and the drain region may be interchangeable with each other. In some embodiments, the first doped region and the second doped region are disposed opposite to and separated from each other.

In some embodiments, the gate structure 103 is disposed on an active region of the substrate 101 surrounded by the isolation or STI. In some embodiments, the gate structure 103 is disposed over the substrate 101. In some embodiments, the gate structure 103 is disposed over the resistance variable layer 102. In some embodiments, the gate structure 103 is disposed between the first doped region and the second doped region.

In some embodiments, the gate structure 103 includes a gate dielectric 103a and a gate electrode 103b over the gate dielectric 103a. In some embodiments, the gate dielectric 103a has a high dielectric constant (k) and therefore is a high k dielectric. In some embodiments, the gate dielectric 103a has a large band gap. In some embodiments, the gate dielectric 103a includes high k material such as hafnium dioxide ($HfO_2$), aluminum oxide ($Al_2O_3$), aluminum nitride (AlN) or the like. In some embodiments, the gate dielectric 103a is not ferroelectric and does not include ferroelectric material.

In some embodiments, the gate electrode 103b includes a work function layer and a metallic layer over the work function layer. In some embodiments, the work function layer includes conductive material such as titanium nitride (TiN), tantalum nitride (TaN) or the like. In some embodiments, the metallic layer includes conductive material such as polysilicon (Poly Si), aluminum, copper, titanium, tantalum, tungsten, cobalt, nickel silicide or the like. In some embodiments, a spacer (not shown) is disposed around the gate dielectric 103a and the gate electrode 103b. In some embodiments, the spacer includes insulating material such as silicon oxide, silicon nitride or the like.

In some embodiments, a dielectric layer 104 is disposed over the substrate 101 and the gate structure 103. In some embodiments, the dielectric layer 104 is disposed over the first surface 101a of the substrate 101. In some embodiments, the dielectric layer 104 is disposed over the resistance variable layer 102. In some embodiments, the dielectric layer 104 is in contact with the resistance variable layer 102. In some embodiments, the gate structure 103 is surrounded by the dielectric layer 104. In some embodiments, the dielectric layer 104 can be in multiple layers configuration and thus can include several dielectric layers stacking over each other.

In some embodiments, the dielectric layer 104 can be referred as an interlayer dielectric (ILD). In some embodiments, the f dielectric layer 104 includes one or more layers of silicon based insulating material, such as SiO2, SiN, SiOC, SiCN, SiOCN or SiON. In some embodiments, a silicide layer is formed between the dielectric layer 104 and the substrate 101 and between the gate electrode 103b and the dielectric layer 104 for improving electrical conductivity.

In some embodiments, several contact plugs 105 are disposed within and extending through the dielectric layer 104. In some embodiments, the contact plug 105 includes conductive material such as titanium nitride, tantalum nitride, aluminum, copper, titanium, tantalum, tungsten, cobalt, nickel silicide or the like. In some embodiments, the contact plug 105 contacts the resistance variable layer 102 or the gate electrode 103b. In some embodiments, the contact plug 105 is disposed above the first doped region or the second doped region.

In some embodiments, the contact plugs 105 include a first contact plug 105a and a second contact plug 105b. In some embodiments, the first contact plug 105a is disposed opposite to the second contact plug 105b. In some embodiments, the first contact plug 105a is disposed adjacent to the first doped region, and the second contact plug 105b is disposed adjacent to the second doped region. In some embodiments, the first contact plug 105a is a source contact, and the second contact plug 105b is a drain contact. In some embodiments, the contact plugs 105 include a third contact plug 105c contacting the gate electrode 103b. In some embodiments, the third contact plug 105c is a gate contact.

In some embodiments, a distance d between the first contact plug 105a and the second contact plug 105b is about 20 nm to about 30 nm. In some embodiments, the distance d is about 10 nm to about 50 nm. In some embodiments, the first contact plug 105a and the substrate 101 are connected to an electrical ground. In some embodiments, a drain voltage ($V_{ds}$) or a voltage difference between the first contact plug 105a and the second contact plug 105b is applied. In some embodiments, a current ($I_D$) can flow through the resistance variable layer 102 across the first contact plug 105a and the second contact plug 105b.

In some embodiments, there is a coercive electric field ($E_c$) in the resistance variable layer 102. In some embodiments, when the drain voltage ($V_{ds}$) or the voltage difference between the first contact plug 105a and the second contact plug 105b is applied, an electric field is generated. In some embodiments, a polarization state of the resistance variable layer 102 is switched when the electric field is substantially greater than the coercive electric field ($E_c$). In some embodiments, the polarization state of the resistance variable layer 102 is switched when the drain voltage ($V_{ds}$) or a voltage difference between the first contact plug 105a and the second contact plug 105b substantially greater than a coercive voltage ($V_c$) of the resistance variable layer 102 is applied.

In some embodiments, a direction of the coercive electric field ($E_c$) is in parallel to a direction of the polarization state of the resistance variable layer 102. In some embodiments, the polarization state of the resistance variable layer 102 points to a first side of the semiconductor structure 100 when the drain voltage ($V_{ds}$) is positive, and the polarization state of the resistance variable layer 102 points to a second side of the semiconductor structure 100 when the drain voltage ($V_{ds}$) is negative. In some embodiments, the first side is opposite to the second side. In some embodiments, the first side is the right side of the semiconductor structure 100, and the second side is the left side of the semiconductor structure 100.

After the switching of the polarization state of the resistance variable layer 102, the drain voltage ($V_{ds}$) is fixed and then the first semiconductor structure 100 can be operated by varying a gate voltage ($V_g$) applied to the gate structure 103. In some embodiments, the drain voltage ($V_{ds}$) is fixed at a voltage substantially less than the coercive voltage ($V_c$) during the operation of the first semiconductor structure 100. As a result, the current ($I_D$) flowing through the resistance variable layer 102 varies depending on the gate voltage ($V_g$) applied to the gate structure 103.

Figure 2:
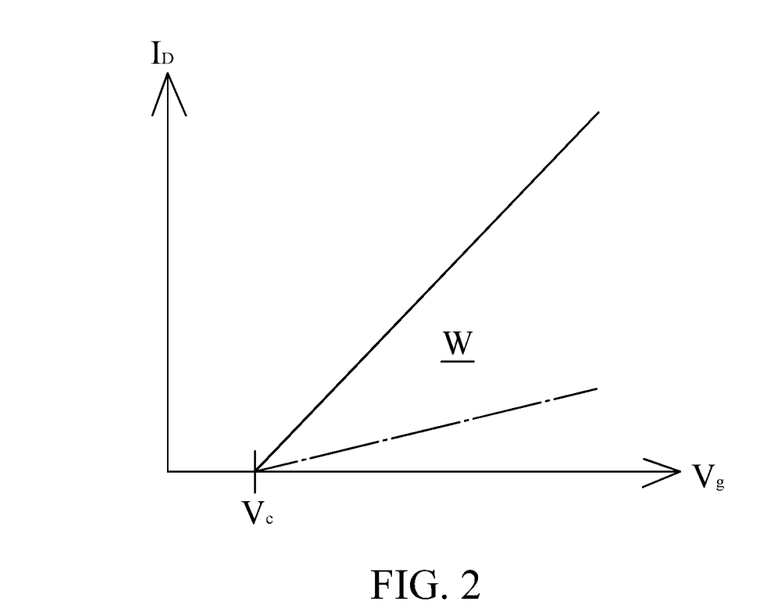
FIG. 2 is a graph illustrating a relationship between a current flowing through a resistance variable layer and a voltage applied to the semiconductor structure.

FIG. 2 is a graph illustrating a relationship between the current ($I_D$) flowing through the resistance variable layer 102 and the gate voltage ($V_g$) for operating the first semiconductor structure 100. In some embodiments, when the drain voltage ($V_{ds}$) is positive and substantially greater than the coercive voltage ($V_c$) of the resistance variable layer 102, the polarization state of the resistance variable layer 102 points to the first side (e.g. the right side) and the coercive electric field ($E_c$) points to the right. As such, the current ($I_D$) flowing through the resistance variable layer 102 varies along the solid line in FIG. 2 depending on the gate voltage ($V_g$) applied to the gate structure 103.

In some embodiments, when the drain voltage ($V_{ds}$) is negative and the absolute value of the drain voltage ($V_{ds}$) is substantially greater than the coercive voltage ($V_c$) of the resistance variable layer 102, the polarization state of the resistance variable layer 102 points to the second side (e.g. the left side) and the coercive electric field ($E_c$) points to the left. As such, the current ($I_D$) flowing through the resistance variable layer 102 varies along the dash dot line in FIG. 2 depending on the gate voltage ($V_g$) applied to the gate structure 103.

In some embodiment, the positive polarization state directed to the first side (e.g. the right side) is served as an additional electric field in the resistance variable layer 102, while the negative polarization state directed to the second side (e.g. the left side) is served as an opposing electric field in the resistance variable layer 102. As a result, the current ($I_D$) flowing through the resistance variable layer 102 under the positive polarization state is substantially greater than the current ($I_D$) flowing through the resistance variable layer 102 under the negative polarization state. In other words, a wider memory window W of the first semiconductor structure 100 having the resistance variable layer 102 is obtained as shown in FIG. 2.

In some embodiments, the coercive voltage ($V_c$) of the resistance variable layer 102 is about 2V to about 3V. In some embodiments, the coercive voltage ($V_c$) is about 1V to about 5V. In some embodiments, the coercive electric field ($E_c$) of the resistance variable layer 102 is about 1 MV/cm. In some embodiments, the coercive electric field ($E_c$) of the resistance variable layer 102 is substantially less than about 5 MV/cm.

In some embodiments, a conductive structure 106 is disposed over the dielectric layer 104. In some embodiments, the conductive structure 106 is electrically connected to the contact plug 105. In some embodiments, the conductive structure 106 includes conductive material such as titanium nitride, tantalum nitride, aluminum, copper, titanium, tantalum, tungsten, cobalt, nickel silicide or the like. In some embodiments, the conductive structure 106 is a via configured to connect to an external circuitry or electrical component.

Figure 3:
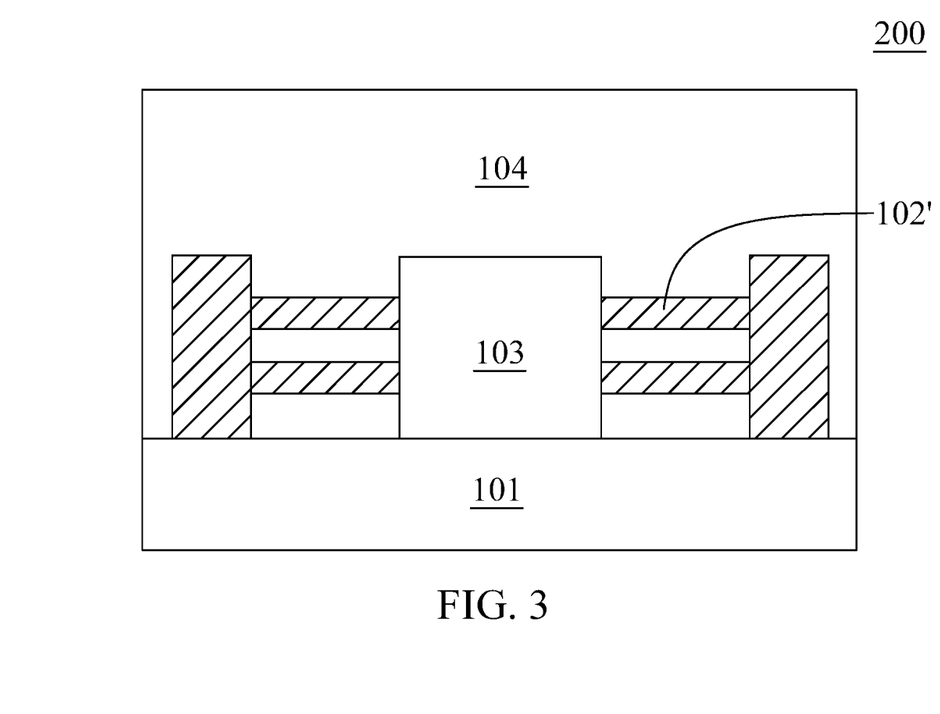
FIG. 3 is a schematic cross-sectional view of a second semiconductor structure in accordance with some embodiments of the present disclosure.

FIG. 3 is a schematic cross sectional view of a second semiconductor structure 200 in accordance with some embodiments of the present disclosure. In some embodiments, the second semiconductor structure 200 is similar to the first semiconductor structure 100, except the resistance variable layer 102 is configured in nanowire shape as a resistance variable member 102'. In some embodiments, the resistance variable member 102' is semiconductive and ferroelectric. In some embodiments, the resistance variable member 102' includes a first doped region and a second doped region. In some embodiments, the gate structure 103 is disposed between the first doped region and the second doped region. In some embodiments, several contact plugs extend from and contact the resistance variable member 102'. In some embodiments, the first doped region and the second doped region are part of the contact plugs.

In some embodiments, the resistance variable member 102' includes ferroelectric material disposed within or around the resistance variable member 102'. In some embodiments, the resistance variable member 102' is a ferroelectric channel. In some embodiments, the second semiconductor structure 200 is a nanowire (NW) FET. In some embodiments, the second semiconductor structure 200 is a gate all round (GAA) NWFET. In some embodiments, the second semiconductor structure 200 is a lateral GAA NWFET.

In some embodiments, there is a coercive electric field ($E_c$) in the resistance variable member 102'. In some embodiments, when the drain voltage ($V_{ds}$) or the voltage difference between the contact plugs is applied, an electric field is generated. In some embodiments, a polarization state of the resistance variable member 102' is switched when the electric field is substantially greater than the coercive electric field ($E_c$). In some embodiments, the polarization state of the resistance variable member 102' is switched when the drain voltage ($V_{ds}$) substantially greater than a coercive voltage ($V_c$) of the resistance variable member 102' is applied.

In some embodiments, a direction of the coercive electric field ($E_c$) is in parallel to a direction of the polarization state of the resistance variable member 102'. In some embodiments, the polarization state of the resistance variable member 102' points to the right side of the second semiconductor structure 200 when the drain voltage ($V_{ds}$) is positive. In some embodiments, the polarization state of the resistance variable member 102' points to the left side of the second semiconductor structure 200 when the drain voltage ($V_{ds}$) is negative.

After the change of the polarization state of the resistance variable member 102', the drain voltage ($V_{ds}$) is fixed and then the second semiconductor structure 200 can be operated by varying a gate voltage ($V_g$) applied to the gate structure 103. In some embodiments, the drain voltage ($V_{ds}$) is fixed at a voltage substantially less than the coercive voltage ($V_c$) during the operation of the second semiconductor structure 200. As a result, the current ($I_D$) flowing through the resistance variable member 102' varies depending on the gate voltage ($V_g$) applied to the gate structure 103.

Figure 4:
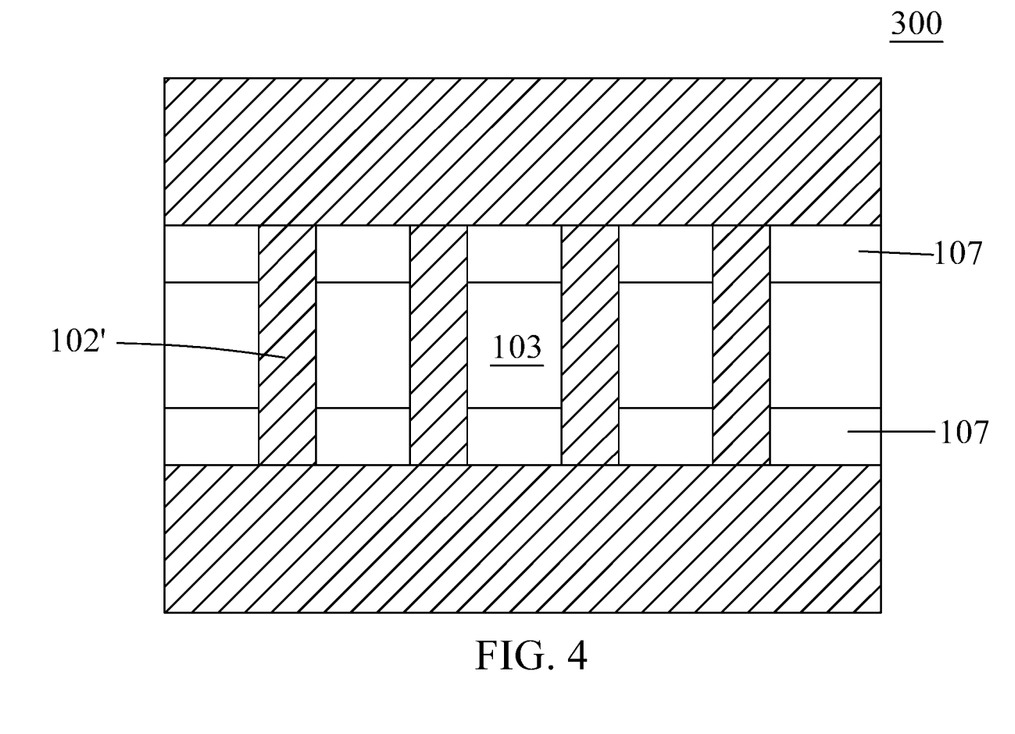
FIG. 4 is a schematic cross-sectional view of a third semiconductor structure in accordance with some embodiments of the present disclosure.

FIG. 4 is a schematic cross sectional view of a third semiconductor structure 300 in accordance with some embodiments of the present disclosure. In some embodiments, the third semiconductor structure 300 is similar to the second semiconductor structure 200, except the resistance variable member 102' is oriented vertically across the gate structure. In some embodiments, the resistance variable member 102' is semiconductive and ferroelectric. In some embodiments, the gate structure 103 covers the resistance variable member 102'. In some embodiments, the resistance variable member 102' includes a first doped region and a second doped region. In some embodiments, the gate structure 103 is disposed between the first doped region and the second doped region. In some embodiments, several contact plugs extend from and contact the resistance variable member 102'.

In some embodiments, the resistance variable member 102' includes ferroelectric material disposed within or around the resistance variable member 102'. In some embodiments, the resistance variable member 102' is a ferroelectric channel. In some embodiments, the gate structure 103 is disposed between spacers 107. In some embodiments, the resistance variable member 102' extends through the gate structure 103 and the spacers 107. In some embodiments, the third semiconductor structure 300 is a vertical GAA NWFET.

In some embodiments, a direction of the coercive electric field ($E_c$) is in parallel to a direction of the polarization state of the resistance variable member 102'. In some embodiments, the polarization state of the resistance variable member 102' points upwardly when the drain voltage ($V_{ds}$) is positive. In some embodiments, the polarization state of the resistance variable member 102' points downwardly when the drain voltage ($V_{ds}$) is negative.

In some embodiments, when the drain voltage ($V_{ds}$) is applied, a resistance of the resistance variable member 102' is variable according to the polarization states of the resistance variable member 102'. After the change of the polarization state of the resistance variable member 102', the drain voltage ($V_{ds}$) is fixed and then the third semiconductor structure 300 can be operated by varying a gate voltage ($V_g$) applied to the gate structure 103. In some embodiments, the drain voltage ($V_{ds}$) is fixed at a voltage substantially equal to or less than the coercive voltage ($V_c$) during the operation of the third semiconductor structure 300. As a result, the current ($I_D$) flowing through the resistance variable member 102' varies depending on the gate voltage ($V_g$) applied to the gate structure 103.

Figure 5:
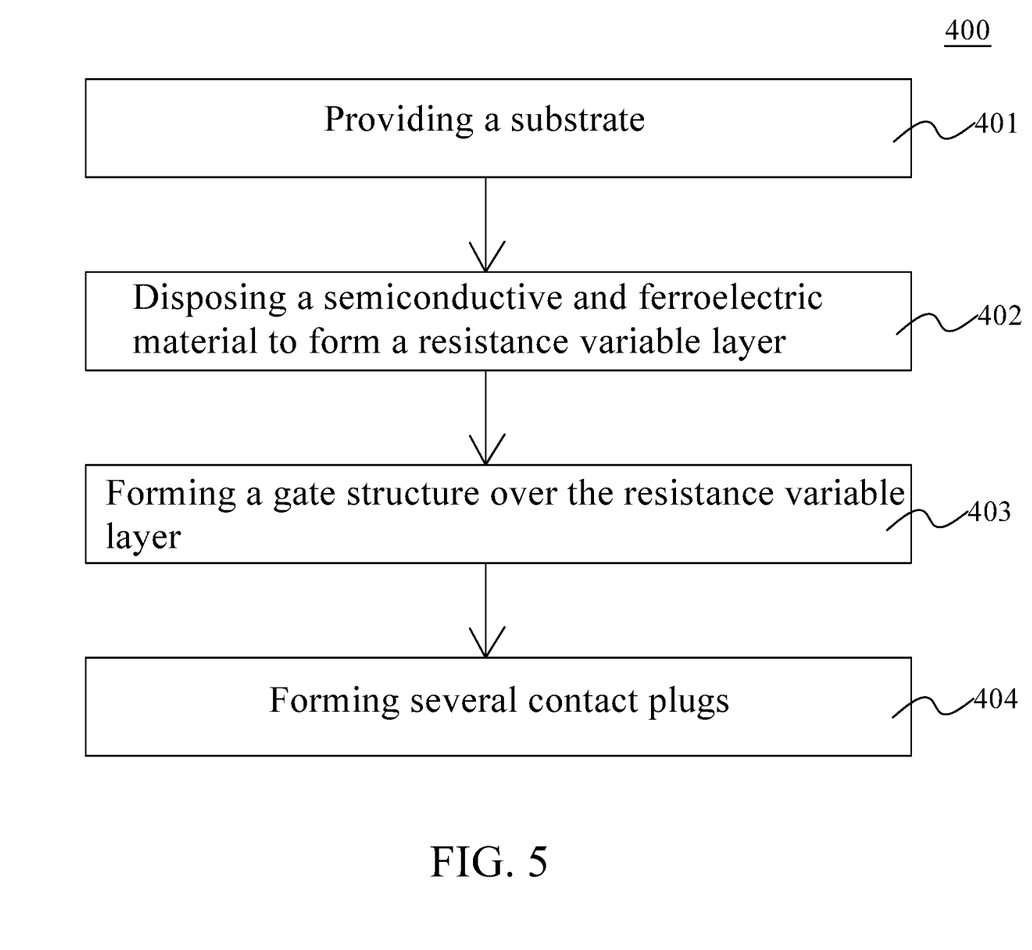
FIG. 5 is a flow diagram of a method of manufacturing a semiconductor structure in accordance with some embodiments of the present disclosure.

In the present disclosure, a method of manufacturing a semiconductor structure is disclosed. In some embodiments, a semiconductor structure (100, 200 or 300) can be formed by a method 400 illustrated in FIG. 5. The method 400 includes a number of operations and the description and illustration are not deemed as a limitation as the sequence of the operations. The method 300 includes a number of operations (401, 402, 403 and 404).

Figure 6:
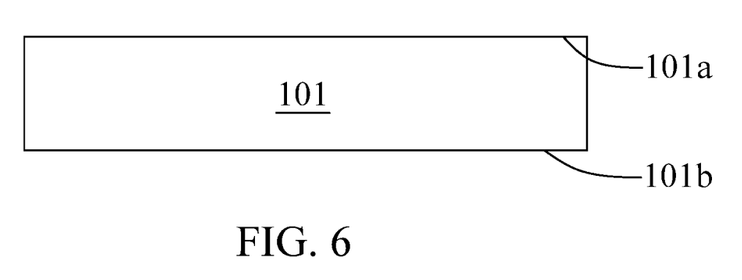
FIGS. 6-11 are schematic views of manufacturing a semiconductor structure by a method of FIG. 5 in accordance with some embodiments of the present disclosure.

In operation 401, a substrate 101 is provided as shown in FIG. 6. In some embodiments, the substrate 101 includes a silicon substrate, a silicon germanium substrate, or a substrate formed of other semiconductor materials. In some embodiments, the substrate 101 includes silicon, silicon germanium, silicon carbide, or a group III-V semiconductor. In some embodiments, the substrate 101 is in configuration similar to the one described above or illustrated in FIG. 1.

Figure 7:
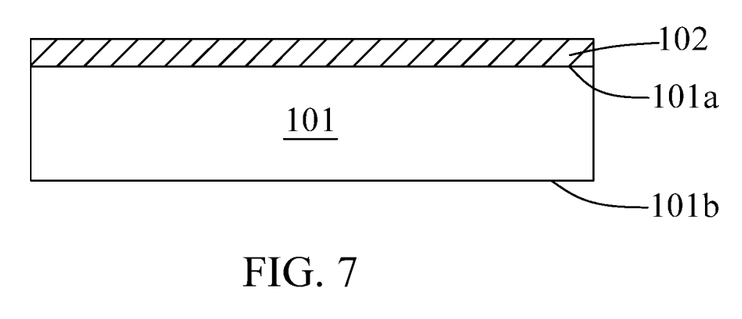

In operation 402, a semiconductive and ferroelectric material is disposed to form a resistance variable layer 102 as shown in FIG. 7. In some embodiments, the semiconductive and ferroelectric material includes III-V semiconductor based ferroelectric material. In some embodiments, the semiconductive and ferroelectric material includes III-nitride. In some embodiments, the semiconductive and ferroelectric material includes wurtzite nitride. In some embodiments, the semiconductive and ferroelectric material includes scandium (Sc) and nitride (N). In some embodiments, the semiconductive and ferroelectric material includes scandium doped nitride. In some embodiments, the semiconductive and ferroelectric material includes scandium doped aluminum nitride (AlScN), scandium doped indium nitride (InScN) or scandium doped gallium nitride (GaScN).

In some embodiments, the semiconductive and ferroelectric material is disposed over the substrate 101. In some embodiments, the semiconductive and ferroelectric material is disposed on the first surface 101a of the substrate 101. In some embodiments, the semiconductive and ferroelectric material is disposed by deposition, atomic layer deposition (ALD), physical vapor deposition (PVD), sputtering or any other suitable operations. In some embodiments, the resistance variable layer 102 is a ferroelectric channel.

In some embodiments, the resistance variable layer 102 is formed with ferroelectric crystalline. In some embodiments, the ferroelectric crystalline in the resistance variable layer 102 can be oriented in parallel to a direction of a current flowing through the resistance variable layer 102. In some embodiments, the resistance variable layer 102 is in configuration similar to the one described above or illustrated in FIG. 1.

In some embodiments, the resistance variable layer 102 includes a first doped region and a second doped region. In some embodiments, the first doped region and the second doped region are formed by implantation using predetermined dopants or any other suitable operations.

Figure 8:
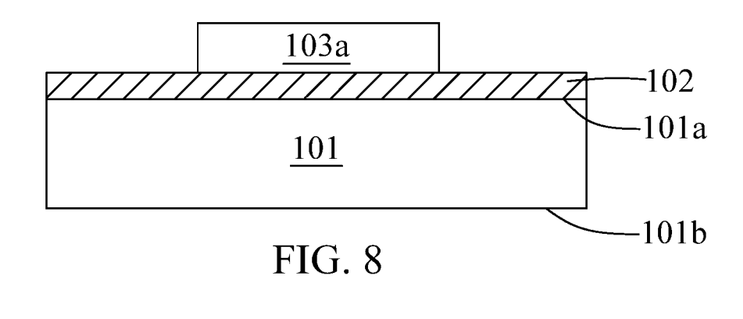
Figure 9:
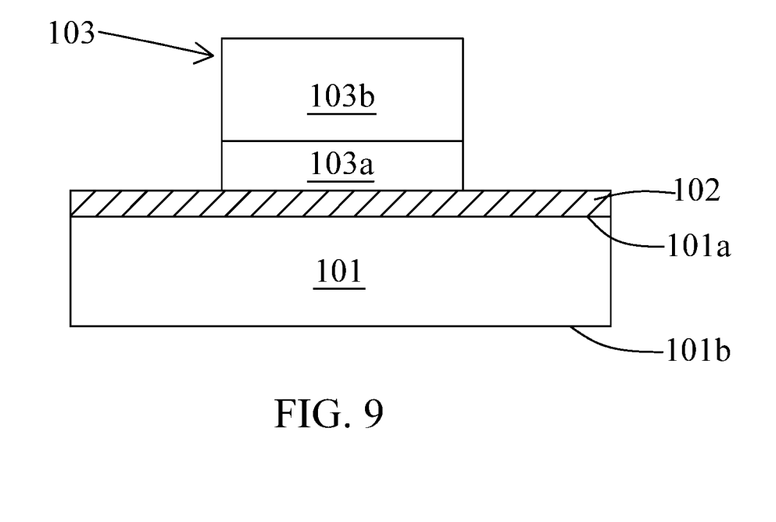

In operation 403, a gate structure 103 is formed over the resistance variable layer 102 as shown in FIGS. 8 to 9. In some embodiments, the formation of the gate structure 103 includes disposing a gate dielectric 103a and forming a gate electrode 103b over the gate dielectric 103a. In some embodiments as shown in FIG. 8, the gate dielectric 103a is disposed over the resistance variable layer 102. In some embodiments, the gate dielectric 103a is disposed by deposition, PVD, chemical vapor deposition (CVD) or any other suitable operations. In some embodiments, the disposing of the gate dielectric 103a includes disposing high k dielectric over the resistance variable layer 102. In some embodiments, the gate dielectric 103a includes hafnium dioxide (HfO$_2$), aluminum oxide (Al$_2$O$_3$), aluminum nitride (AlN) or the like. In some embodiments, the gate dielectric 103a is in configuration similar to the one described above or illustrated in FIG. 1.

In some embodiments as shown in FIG. 9, the gate electrode 103b is formed over the gate dielectric 103a. In some embodiments, the gate electrode 103b is formed by disposing a conductive material over the gate dielectric 103a. In some embodiments, the conductive material includes polysilicon (Poly Si), aluminum, copper, titanium, tantalum, tungsten, cobalt, nickel silicide or the like. In some embodiments, the gate electrode 103b is in configuration similar to the one described above or illustrated in FIG. 1. In some embodiments, the gate structure 103 is formed and in configuration similar to the one described above or illustrated in FIG. 1.

Figure 10:
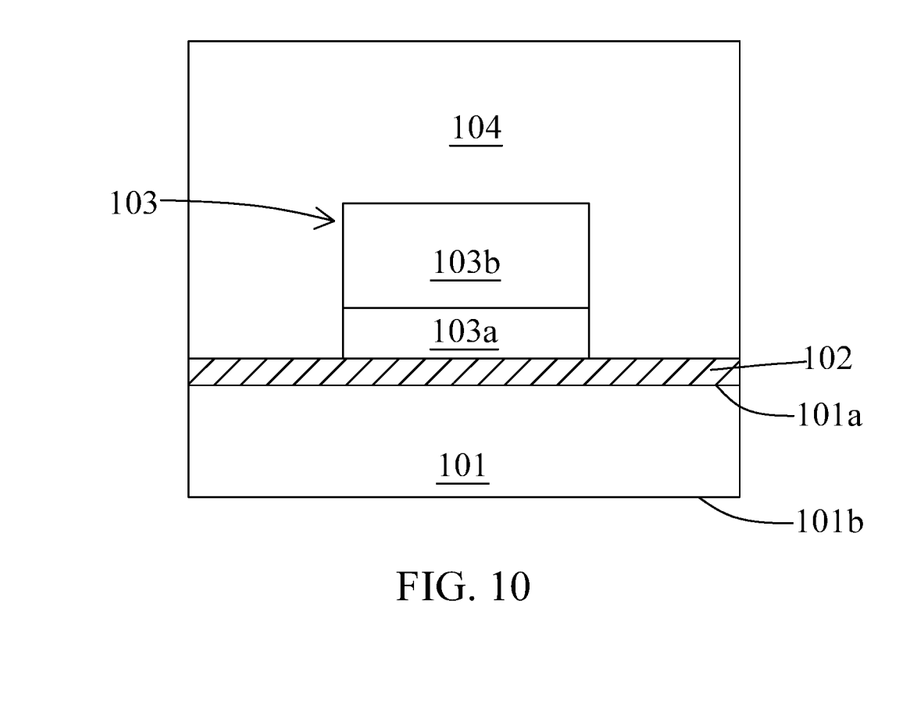

In some embodiments, a dielectric layer 104 is disposed over the substrate 101, the resistance variable layer 102 and the gate structure 103 as shown in FIG. 10. In some embodiments, the dielectric layer 104 is disposed by deposition, PVD, CVD, spinning or any other suitable operations. In some embodiments, the dielectric layer 104 is an ILD layer. In some embodiments, the dielectric layer 104 is in configuration similar to the one described above or illustrated in FIG. 1.

Figure 11:
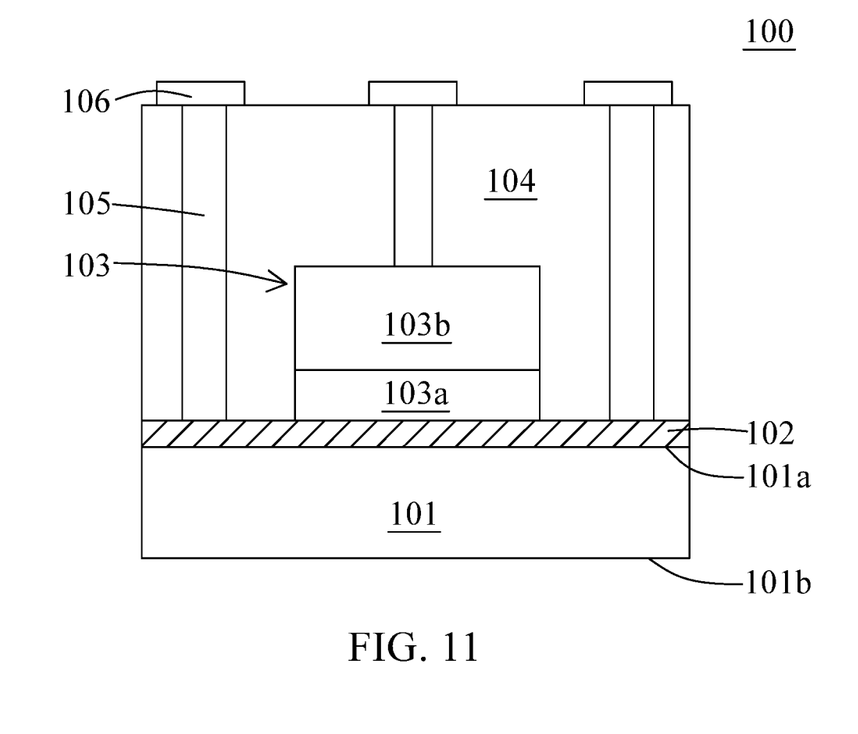

In operation 404, several contact plugs 105 are formed within the dielectric layer 104 as shown in FIG. 11. In some embodiments, the contact plug 105 is formed by removing a portion of the dielectric layer 104 to form an opening and disposing a conductive material into the opening. In some embodiments, the contact plugs 105 are formed separately or simultaneously. In some embodiments, the contact plugs 105 are in configurations similar to those described above or illustrated in FIG. 1.

In some embodiments, a conductive structure 106 is formed over the contact plug 105 as shown in FIG. 11. In some embodiments, the conductive structure 106 is formed by disposing conductive material such as aluminum, copper, titanium, tantalum, tungsten or the like over the contact plug 105. In some embodiments, the conductive material is disposed by electroplating, sputtering or any other suitable operations. In some embodiments, the conductive structure 106 is in configurations similar to those described above or illustrated in FIG. 1. In some embodiments, a semiconductor structure 100 as shown in FIG. 1 is formed.

In the present disclosure, a semiconductor structure is disclosed. The semiconductor structure includes a resistance variable layer over the substrate. The resistance variable layer is semiconductive and ferroelectric. Since the resistance variable layer is ferroelectric, polarization states of the resistance variable layer is switchable. As a result, a resistance of the resistance variable layer can be varied according to the switching of the polarization states. Therefore, a wider memory window for the semiconductor structure can be obtained.

In some embodiments, a semiconductor structure includes a substrate; a resistance variable layer disposed over the substrate; a gate structure disposed over the resistance variable layer; a dielectric layer disposed over the resistance variable layer and surrounding the gate structure; a first contact plug disposed over the resistance variable layer and extending through the dielectric layer; and a second contact plug disposed over the resistance variable layer and opposite to the first contact plug and extending through the dielectric layer, wherein the resistance variable layer is semiconductive and ferroelectric.

In some embodiments, the resistance variable layer includes III-V semiconductor based ferroelectric material. In some embodiments, the resistance variable layer includes scandium (Sc) and nitride (N). In some embodiments, the resistance variable layer includes scandium doped aluminum nitride (AlScN), scandium doped indium nitride (InScN) or scandium doped gallium nitride (GaScN). In some embodiments, the gate structure includes a gate dielectric disposed over the resistance variable layer and has a high dielectric constant (high k). In some embodiments, a distance between the first contact plug and the second contact plug is about 20 nm to about 30 nm.

In some embodiments, a polarization state of the resistance variable layer is switched when a voltage applied between the first contact plug and the second contact plug is substantially greater than a coercive voltage of the resistance variable layer. In some embodiments, the coercive voltage of the resistance variable layer is about 2V to about 3V. In some embodiments, a coercive electric field of the resistance variable layer is about 1 MV/cm. In some embodiments, a ferroelectric crystalline in the resistance variable layer is oriented substantially parallel to a current flowing through the resistance variable layer.

In some embodiments, a semiconductor structure includes a substrate; a ferroelectric channel disposed over the substrate; a first contact plug disposed over and extending from the ferroelectric channel; a second contact plug disposed over and extending from the ferroelectric channel and disposed opposite to the first contact plug; and a gate structure disposed over the ferroelectric channel and between the first contact plug and the second contact plug, wherein a current flowing through the ferroelectric channel is variable depending on a polarization state of the ferroelectric channel.

In some embodiments, the ferroelectric channel includes scandium doped nitride. In some embodiments, the current flowing through the ferroelectric channel varies according to a voltage applied to the gate structure. In some embodiments, the polarization state of the ferroelectric channel is directed to a first side of the semiconductor structure when a voltage applied between the first contact plug and the second contact plug is positive, and the polarization state of the ferroelectric channel is directed to a second side of the semiconductor structure opposite to the first side when the voltage applied between the first contact plug and the second contact plug is negative. In some embodiments, the first side is right side of the semiconductor structure, and the second side is left side of the semiconductor structure.

In some embodiments, the ferroelectric channel includes a source region adjacent to the first contact plug and a drain region adjacent to the second contact plug. In some embodiments, the ferroelectric channel covers an entire surface of the substrate. In some embodiments, the ferroelectric channel is in nanowire configuration.

In some embodiments, a method of manufacturing a semiconductor structure includes providing a substrate; disposing a semiconductive and ferroelectric material over the substrate to form a resistance variable layer; forming a gate structure over the resistance variable layer; and forming a plurality of contact plugs extending from the resistance variable layer.

In some embodiments, the semiconductive and ferroelectric material is disposed by deposition operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a resistance variable layer disposed on the substrate;
   a gate structure disposed over the resistance variable layer, and including a gate dielectric on the resistance variable layer and a gate electrode on the gate dielectric;
   a dielectric layer disposed over the resistance variable layer and surrounding and covering the gate structure;
   a first contact plug disposed on the gate electrode and extending through the dielectric layer; and
   a first conductive pad disposed on the dielectric layer and in contact with the first contact plug,
   wherein the resistance variable layer is semiconductive and ferroelectric, and
   the gate dielectric is free of ferroelectric material.

2. The semiconductor structure of claim 1, further comprising a second contact plug disposed on the resistance variable layer and extending through the dielectric layer, wherein a height of the first contact plug is substantially less than a height of the second contact plug.

3. The semiconductor structure of claim 2, wherein a polarization state of the resistance variable layer is switched when a voltage applied between the first contact plug and the second contact plug is substantially greater than a coercive voltage of the resistance variable layer.

4. The semiconductor structure of claim 1, wherein the resistance variable layer includes III-V semiconductor based ferroelectric material.

5. The semiconductor structure of claim 1, wherein the resistance variable layer includes scandium (Sc), nitride (N), scandium doped aluminum nitride (AlScN), scandium doped indium nitride (InScN) or scandium doped gallium nitride (GaScN).

6. The semiconductor structure of claim 3, wherein the coercive voltage of the resistance variable layer is about 2V to about 3V.

7. The semiconductor structure of claim 1, wherein a ferroelectric crystalline in the resistance variable layer is oriented substantially parallel to a current flowing through the resistance variable layer.

8. A semiconductor structure, comprising:
   a substrate;
   a gate structure disposed on the substrate;
   a ferroelectric channel disposed over the substrate extending through the gate structure; and
   a dielectric layer disposed on the substrate and surrounding and covering the gate structure and the ferroelectric channel,
   wherein the ferroelectric channel is in a nanowire configuration, and at least a portion of the ferroelectric channel is surrounded by the gate structure, and
   wherein a height of the dielectric layer between the substrate and the ferroelectric channel is less than a height of the gate structure.

9. The semiconductor structure of claim 8, wherein the ferroelectric channel is semiconductive.

10. The semiconductor structure of claim 8, wherein the ferroelectric channel includes a first doped region and a second doped region, the gate structure is between the first doped region and the second doped region.

11. The semiconductor structure of claim 8, wherein the ferroelectric channel is isolated from the substrate by the gate structure and the dielectric layer.

12. The semiconductor structure of claim 8, wherein the semiconductor structure is a gate all round (GAA) nanowire (NW) field effect transistor (FET).

13. A method of manufacturing a semiconductor structure, comprising:
    providing a substrate;
    forming a gate structure over the substrate;
    forming a ferroelectric channel extending through the gate structure;
    disposing a dielectric layer over the substrate and surrounding and covering the gate structure and the ferroelectric channel, wherein a height of the dielectric layer between the substrate and the ferroelectric channel is less than a height of the gate structure; and
    applying a drain voltage across the ferroelectric channel to switch a polarization state of the ferroelectric channel,
    wherein during switching the polarization state of the ferroelectric channel, the drain voltage is substantially greater than a coercive voltage of the ferroelectric channel, and a direction of the polarization state is substantially parallel to a direction of a current flowing through the ferroelectric channel.

14. The method of claim 13, wherein the drain voltage is fixed after switching the polarization state of the ferroelectric channel.

15. The method of claim 13, further comprising, after switching the polarization state of the ferroelectric channel:
    operating the semiconductor structure, wherein the drain voltage is fixed at a voltage substantially less than the coercive voltage during the operation of the semiconductor structure.

16. The method of claim 13, wherein the polarization state of the ferroelectric channel points to a first lateral side when the drain voltage is positive, and the polarization state of the ferroelectric channel points to a second lateral side opposite to the first lateral side when the drain voltage is negative.

17. The method of claim 13, wherein the ferroelectric channel includes a first contact plug and a second contact plug, the gate structure is disposed between the first contact plug and the second contact plug.

18. The method of claim 17, further comprising forming a third contact plug on the gate structure.

19. The method of claim 18, further comprising varying a gate voltage applied to the third contact plug.

20. The method of claim 19, wherein the drain voltage is applied between the first contact plug and the second contact plug, and the current flowing through the ferroelectric channel varies according to the gate voltage applied to the third contact plug.

* * * * *